United States Patent [19]

Sun et al.

[11] Patent Number: 4,795,915

[45] Date of Patent: Jan. 3, 1989

[54] ZERO CROSSING NOISE-REJECTING DIGITAL FILTER

[75] Inventors: Koushun Sun, Elgin; Sam Albanese, Chicago, both of Ill.

[73] Assignee: Motorola, Inc., Schaumburg, Ill.

[21] Appl. No.: 133,765

[22] Filed: Dec. 14, 1987

[51] Int. Cl.$^4$ ............................................. H03K 5/153
[52] U.S. Cl. .................................. 307/234; 307/354; 307/518; 328/150
[58] Field of Search ............... 307/234, 354, 517, 518; 328/111, 109, 112, 150

[56] References Cited

U.S. PATENT DOCUMENTS

| | | | |
|---|---|---|---|
| 3,718,864 | 2/1973 | Kelly et al. | 328/115 |
| 3,735,271 | 5/1973 | Leibowitz | 307/234 |
| 4,104,997 | 8/1978 | Padgitt | 123/117 R |
| 4,110,698 | 8/1978 | Petrie | 328/164 |
| 4,137,504 | 1/1979 | Simmons | 328/165 |
| 4,244,376 | 1/1981 | Fisher et al. | 128/731 |
| 4,414,534 | 11/1983 | Whidden | 307/354 |
| 4,742,248 | 5/1988 | Smith et al. | 307/234 |

Primary Examiner—John Zazworsky
Attorney, Agent, or Firm—Robert J. Crawford

[57] ABSTRACT

For use with a reluctance sensor, a digital detector (200) accurately detects, in the presence of noise, a valid transition in the sensor's output signal (10, 202). A first flip-flop (216) is used for sensing a positive going edge (310, 334A) in the sensor signal and for providing an inhibit pulse (312, 332, 336) of a first predetermined time period in response thereto. A second flip-flop (218) responds to the end of the inhibit pulse, if the sensor signal is in the high logic state, by sensing a subsequent negative going edge (318, 334B) in the sensor signal. If the negative going edge is sensed, the digital detector indicates that a valid transition in the sensor signal occurred.

11 Claims, 2 Drawing Sheets

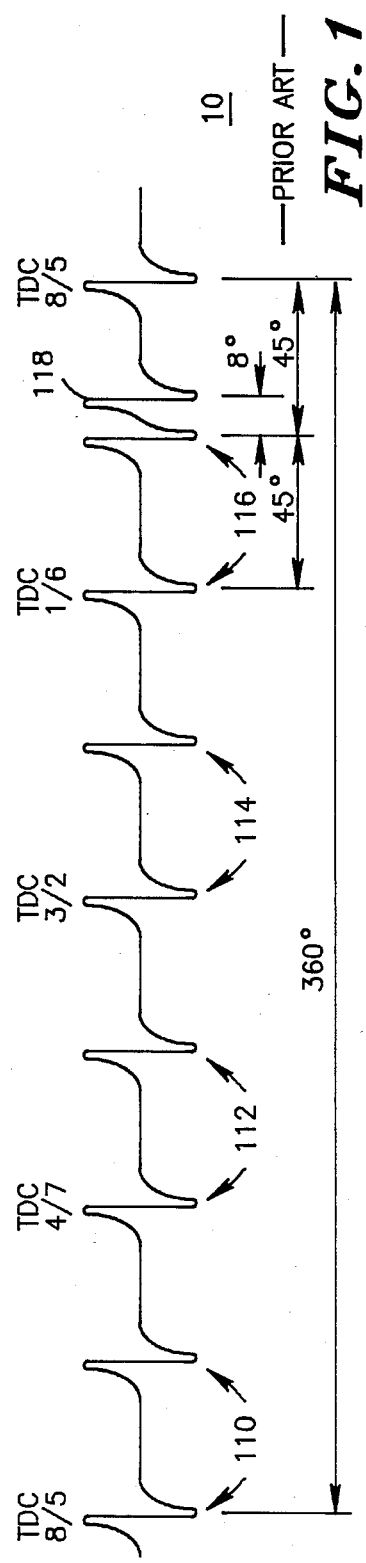
FIG. 1 — PRIOR ART
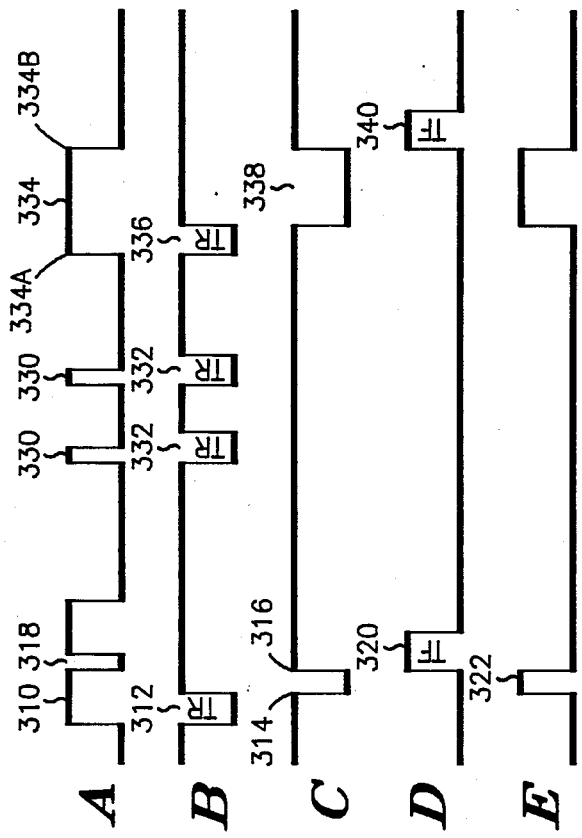
FIG. 3

ZERO CROSSING NOISE-REJECTING DIGITAL FILTER

FIELD OF THE INVENTION

The present invention relates generally to zero crossing detectors, and, more particularly, zero crossing noise-rejecting digital filters for detecting a valid signal generated by a reluctance sensor in the presense of false zero crossing transitions.

DESCRIPTION OF THE PRIOR ART

Zero crossing detection is required in numerous types of applications, including applications employing a reluctance sensor to sense markings on an engine crankshaft. Generally, zero crossing detection involves sensing a positive going and/or negative going transition in a sensor signal. When the transition is sensed, a definitive output signal is generated. In conventional ignition systems this output signal is then processed by an ignition control module to provide spark timing/dwell control for cylinder spark plugs.

In applications where a reluctance sensor is used to sense markings on an engine crankshaft, the differential analog signal, provided by the sensor, remains at some mid-voltage level until a marking is sensed. When a marking is sensed, the analog signal rapidly increases in voltage and then almost instantaneously decreases to a voltage level well below the mid-voltage level. There are a number of analog and digital-type circuits known in the art which sense such transitions.

A potential problem exists with these circuits, however, whenever noise is introduced in the analog signal. Noise in the analog signal is almost indistinguishable from the above described sensor output signal transition, i.e., it rapidly increases in voltage and then instantaneously decreases to a voltage level well below the mid-voltage level. Noise is most commonly introduced in the analog signal through cross-talk via another circuit. In automotive applications, cross-talk typically occurs when a lead carrying a noisy, high voltage signal is situated too close to a lead carrying the analog signal provided by the reluctance sensor. The noise that is introduced may falsely cause the detection of a zero crossing transition in the analog signal, thereby falsely indicating that a mark on the crankshaft was sensed.

Previously known techniques have been somewhat successful in avoiding this problem by sufficiently separating the noisy, high voltage leads from the lead(s) carrying the sensor output signal. However, such separation is burdensome in that separate wiring paths must be designated according to the type of signal that each lead carries.

In addition, various filtering techniques, both passive and active, has been somwwhat successful in reducing the amplitude of the noise, but these techniques have failed to accurately detect a valid transition in the presence of such noise.

Other digital filter attempts to overcome this noise problem have required substantial delays in the detection of the valid transition. In automotive applications, this has caused the engine to be retarded.

Accordingly, a technique for sensing zero crossing transitions is needed which overcomes the aforementioned deficiencies.

OBJECTS OF THE PRESENT INVENTION

It is a general object of the present ivvention to provide a circiit which overcomes the foregoing shortcomings.

It is a more particular object of the present invention to provide a noise-rejecting digital filter which accurately detects valid zero crossing transitions in an analog signal provided by a reluctance sensor.

BRIEF DESCRIPTION OF THE DRAWINGS

The features of the present invention which are believed to be novel are set forth with particularity in the appended claims. The invention, together with further objects and advantages thereof, may best be understood by making reference to the following description taken together with the accompanying drawings, in which reference numerals identify the elements, and wherein:

FIG. 1 is a timing diagram of a conventional reluctance sensor output signal;

FIGS. 3A–3E comprise a series of timing diagrams, according to the present invention, illustrating particular signals generated by the noise-rejecting digital filter of FIG. 2.

DETAILED DESCRIPTION OF THE PREFERRED EMBODIMENT

Figure 2:
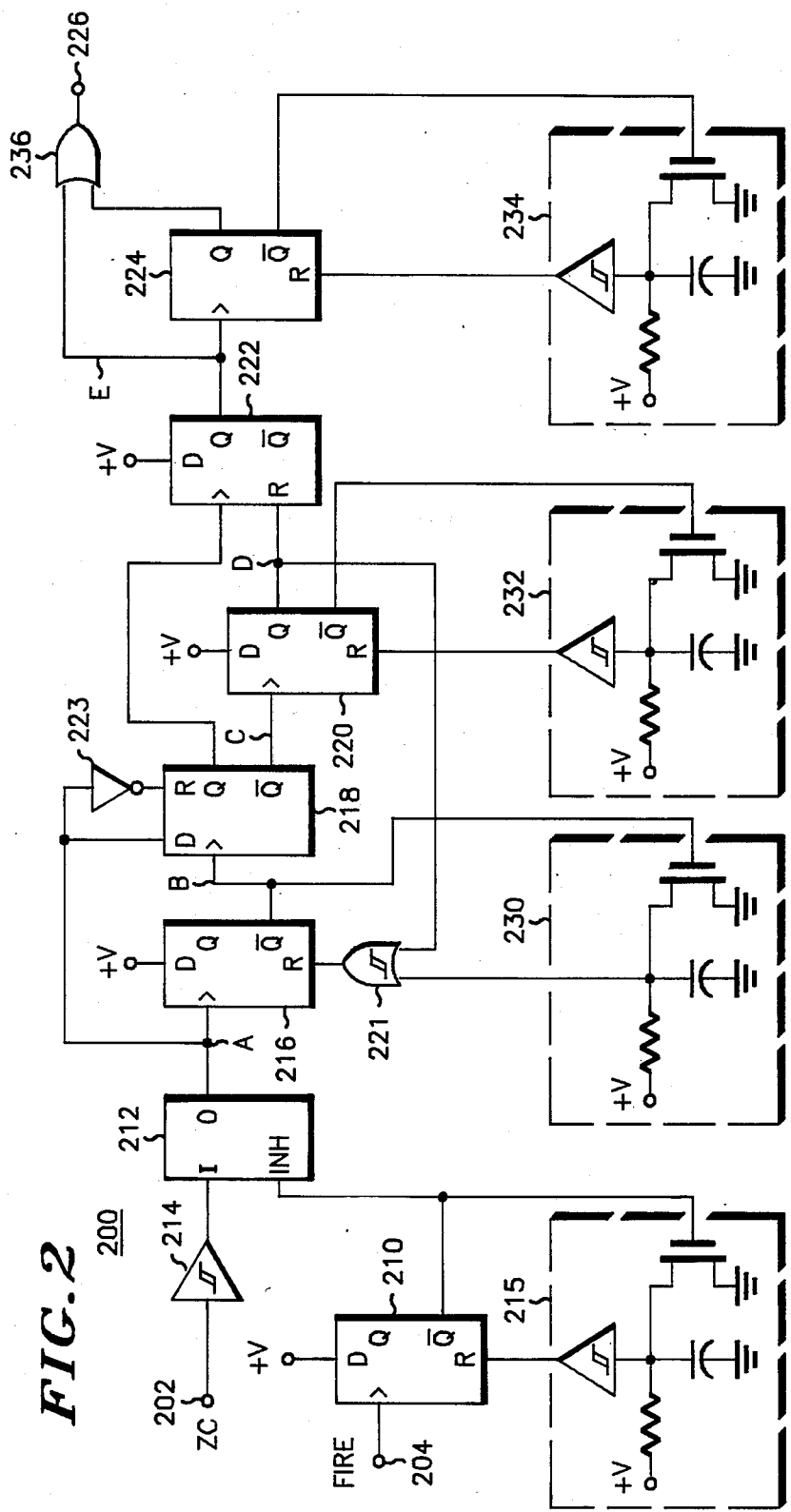
FIG. 2 is a circuit diagram of a noise-rejecting digital filter constructed accordnng to the present invention.

The arrangement disclosed in this specification has particular use for filtering noise from an analog signal having zero crossing transitions. More particularly, the arrangement disclosed herein is directed to detecting valid zero crossing transitions in an analog signal, the signal being provided by a reluctance sensor in a distributorless ignition system, while the analog signal may be carrying noise induced transitions.

FIG. 1 illustrates a conventional timing diagram for such an analog signal 10 provided by a reluctance sensor in an 8-cylinder distributorless ignition system. The diagram illustrates the analog signal for a complete cycle (360°) of crankshaft rotation for such an ignition system. For each of the top-dead-center (TDC) positions of the pistons of eight cylinder, two transitions, each being separatdd by 45°, occur in the analog signal. These transitions are depicted for the spark plugs in pairs as follows: plugs 8/5 110, plugs 4/7 112, plugs 3/2 114 and plugs 6/1 116.

A ninth (SYNC) transition 118 occurs once per cycle, 8° after the second of the 6/1 transitions 116. It represents the synchronization marking on a conventional engine crankshaft employed in a distributorless ignition application.

As previously discussed, known circuits have experienced problems detecting such transitions in the presence of noise. This is because noise coupled onto the analog signal can resemble a zero crossing transition, and may therefore falsely cause invalid transitions to be detected as one of the valid transitions (110 through 118).

To overcome such false detections, according to the present invention, the circuit in FIG. 2 selectively determines whether or not the zero-crossings in the analog signal meet the unique characteristics of a valid transition (110 through 118).

The unique characteristics of a valid transition include a positive going edge in the analog signal 10 followed by a negative going edge more than a predetermined time period after the positive going edge. For the reluctance sensor in the intended application, the predetermined time period which follows the positive going edge is 25 microseconds (usecs.). A false transition detection is avoided, according to the present invention, by a circuit of FIG. 2 first by detecting a positive going edge in the analog signal, and then determining if the positive gonng edge gave rise to a "high" analog signal logic state 25 usecs. later. Second, presuming the previous condition has been satisfied, the circuit in FIG. 2 detects a negative going edge following the positiee going edge in the analog signal. If the transition in the analog signal is due to noise, at least in the intended application, the noise will have subsided before the end of the 25 usec delay, and a high logic state will no longer exist for the analog signal. Of course, the noise which is desired to be filtered for any intended application can be measured, and the predetermined time period can be set therefor.

Not only does the circuit in FIG. 2 prevent noise from creating a false transition detection due to a negative going transition immediately after a positive edge is detected, the circuit also prevents false detections due to noise after a negative edge is detected. This is accomplished in the circuit of FIG. 2 by providing a second predetermined time period during which the detections of positive going edges in the analog signal are inhibited for the second predetermined time period after each detection of a negative going edge.

The second predetermined time period, however, must be carefully selected. At high engine speeds, the second predetermined time period must accommodate a greatly reduced time difference between the SYNC transition 118 and the second of the 6/1 transitions 116. In the intended application, high engine speeds will cause the time difference between the SYNC transition 118 and the second of the 6/1 transitions 116 to decrease to time intervals just above 30 usecs. Thus, the second predetermined time period for the intended application is selected to be 30 usecs.

Referring now to FIG. 2, the circuit 200 therein includes two inputs. The first input is the analog signal 10 illustrated in FIG. 1 and depicted as ZC signal (Zero-Crossing) 202 in FIG. 2.

The second input is FIRE 204, which can be provided by a conventional ignition module circuit (not shown in FIG. 2) such as shown in "Multiple Slope Ignition Spark Timing Circuit", U.S. Pat. No. 4,104,997. FIRE 204 carries an instantaneous pulse whenever one of the engine spark plugs fire. It is used to prevent the circuit 200 from detecting any zero crossing transitions in ZC 202 for approximately 25 usecs. after a spark plug fires. This prevents noise, which is prevalent immediately after such firing, from falsing the circuit 200.

The FIRE function is accomplished by employing a flip-flop (f/f) 210 to inhibit a latch 212 for the 25 usec. time period after FIRE 204 is activated. The latch 212 is designed to receive ZC 202 through a buffer 214 which may be implemented using a conventional differential operational amplifier. Under normal operation, the output (O) follows the input (I) of the latch 212. The inverted Q output of the f/f 210 is coupled to its reset (R) input via a conventional R-C circuit 215 to employ the f/f 210 as a conventional monostable output circuit. The inverted Q output of the f/f 210, in response to the activation of FIRE 204, then produces a 25 usec. pulse to the inhibit input (INH) of the latch 212 to prevent noise from falsing the circuit 200.

The circuit 200 employs five f/fs 216, 218, 220, 222 and 224 to provide an output signal 226 whenever the circuit detects a valid transition in ZC 202. Conventional R-C timnng circuits 230, 232 and 234 are coupled to the respective f/fs 216, 220 and 224 to employ the f/fs 216, 220 and 224 as monostable output circuits.

Essentially, f/f 216 is employed to detect a positive going edge in ZC 202 and to produce an inhibiting pulse at its inverted Q output. The positive going edge in ZC 202 may be the beginning of either a valid transition in ZC or a transition due to noise.

In FIG. 3, a timing diagram illustrates waveforms A through E representing the signals at leads A through E of FIG. 2. FIG. 3 includes an illustration of the f/f's 216 response to a positive going edge in ZC. In particular, a first positive going edge 310 of waveform A (corresponding to the signal 10 of FIG. 1) causes the f/f 216 to produce a negative pulse (TR) 312 of waveform B having a time period of 25 usecs., at its inverted Q output. The negative pulse 312 prevents the circuit 200 from detecting any transitions in ZC until the time period has lapsed.

Once the time period, indicated by the negative pulse 312, has lapsed, if ZC 202 is still in a positive state, i.e., the buffer 214 provides a binary 1 at its output, f/f 218 will be set by the inverted Q output of f/f 216. Thus, after and in response to pulse 312 and in response to the signal of waveform A being high, f/f 218 is enabled so it can detect a subsequent negative going edge in the signal of waveform A. This is illustrated in FIG. 3 wherein the inverted Q output of f/f 218 is shown going low at time 314 of waveform C when the negative pulse 312 of waveform B has lapsed.

Once set, the f/f 218 remains set until a negative going edge, caused by a valid transition or noise, is detected in ZC 202 at the f/f's 218 reset (R) input via an inverter 223. This is illustrated in FIG. 3 wherein the inverted Q output of f/f 218 is shown going high 316 of waveform C when a negative pulse 318 of waveform A is detected. The negative pulse 318 is illustrated as being caused by noise. Nevertheless, the circuit 200 presumes that a valid transition in the analog signal (ZC) has occurred.

Although normally such a pulse 318 will not occur at this time, the presumption made by the circuit of FIG. 2 is appropriate. Because the first positive going edge 310 in ZC of waveform A was due to a valid transition rather than noise, a negative transition was expected. In this instance, however, its detection occurred slightly early. As previously discussed, if the first positive edge produced in ZC 202 would have been due to noise, the noise would have subsided within the 25 usec. time period, indicated by the negative pulse 312, ZC 202 would not still have been in a positive state, and the circuit 200 would not have presumed that a valid transition in the analog signal (ZC) occurred. Thus, the circuit's 200 presumption that a valid transition in the analog signal (ZC) occurred was appropriate even though the negative pulse 318, which triggered the presumption, was caused by noise.

A first pulse 320 of waveform D illustrates the response of the Q output of f/f 220 when the negative pulse 318 of waveform A is detected by f/f 218. The f/f 220 generates a monostable output signal at its Q output, using the crrcuitry 232, having a time period of 30 usecs. This 30 usec. pulse represents the second predetermined time period, previously discussed, which is used to inhibit noise induced positive going transitions in the analog signal from being detected after the detection of the previous valid transition. Essentially, the second predetermined time period provides additional protection from noise falsing the circuit 200.

During this second predetermined time period, f/f 216 is forced to be reset via an OR gate 221 which combines the Q output of f/f 220 with the output from the circuit 230. This prevents the f/f 216 from setting during the second predetermined time period as a result of noise induced transitions on ZC 202.

F/fs 222 and 224 and an OR gate 236 utilize the Q outputs of f/fs 218 and 220 to provide the output signal 226. The output signal 226 represents a conditioned signal to indicate when a valid transition was detected in the analog signal (ZC) 202. The Q output of f/f 222 goes high, via the Q output of f/f 218, at the end of the negative pulse (TR) 312 of waveform B, and goes low, via the Q output of f/f 220, when a negative edge is detected in ZC 202, thereby producing a pulse in response to a transition (with a valid positive going edge) in ZC 202. Such a pulse is illustrated as 322 of waveform E in FIG. 3.

The Q output of f/f 222 is combined with the Q output of f/f 224 at OR gate 236 to ensure that the output signal 226 has a minimum time length. The f/f 224 is set when the f/f 222 is set, and the f/f 224 is reset 10 usecs. later through its circuit 234. Thus, once f/f 222 is set, the output signal 226 will remain active for at least 10 usecs.

Noise transitions (pulses) 330 of waveform A of FIG. 3 illustrate the noise filtering operation of the circuit 200. At the positive going edge of each of the noise transitions 330, the inverted Q output of f/f 216 goes low. This is illustrated by the respective pulses 332 of waveform B in FIG. 3. However, unlike the response to the noise pulse 318 of waveform A, f/f 218 is not set when the time period (TR) established at the inverted Q output of f/f 216 lapses. This is because f/f 218 senses that ZC 202 is no longer in a high state. The circuit 200 is therefore not falsed as a result of the noise pulses 330

The operation of the circuit 200, in the absence of any noise, may best be explained with reference to the transition 334 illustrated in waveform A of FIG. 3. At the positive going edge 334A of the transition 334, the inverted Q output of f/f 216 goes low. This is illustrated by pulse 336 of waveform B. When the inverted Q output of f/f 216 returns high, via the circuit 230, ZC 202 will still be in the high state. Thus, f/f 218 will sense this state at its D input and will force its inverted Q output low until a negative edge is sensed in ZC at its reset input. The Q output of f/f 218 going low is depicted by pulse 338 of waveform C. As a result of f/f 218 detecting the negative going edge 334B of the transition 334, f/f 220 generates a pulse 340 of waveform D to inhibit, for 30 usecs, positive edges (noise-produced) from falsing the circuit 200. The f/fs 222 and 224, responsive to the f/f 218 detecting the negative going edge 334B of transition 334 of waveform A, provide the output signal 226 through the OR gate 236.

Accordingly, With or without noise on the analog signal (ZC), the circuit 200 provides an accurate output signal when a valid transition occurs thereon.

It will be understood by those skilled in the art that various modifications and changes may be made to the present invention without departing from the spirit and scope thereof.

What is claimed is:

1. A detector for indicating a zero crossing transition, having a positive going edge and a negative going edge, in a sensor signal provided by a reluctance sensor, comprising:
   first detection means, responsive to the sensor signal, for sensing a positive going edge in the sensor signal;
   second detection means, for sensing, when enabled, a negative going edge in the sensor signal; and
   first delay means, responsive to the first detection means detecting the positive going edge, for providing a predetermined time period during which the second detection means is prevented from being enabled to sense a negative going edge in the sensor signal, and for indicating the zero crossing transition in the sensor signal in response to the second detection means sensing a negative going edge in the sensor signal.

2. A detector, according to claim 1, wherein the first detection means includes a flip-flop which is set via the positive going edge.

3. A detector, according to claim 2, wherein the first delay means includes means for resetting the flip-flop.

4. A detector, according to claim 1, which includes circuitry for enabling said second detection means if said sensor signal has a predetermined logic state after said predetermined time period has lapsed.

5. A digital detector for indicating zero crossing transitions separated by at least a minimum transition period, each zero crossing transition having a positive going edge and a negative going edge, in a sensor signal provided by a reluctance sensor, wherein at least one burst of noise with an expected time period may randomly cause additional positive going and negative going edges to be present in the sensor signal, comprising:
   first detection means, responsive to the sensor signal, for sensing a positive going edge in the sensor signal;
   second detection means, responsive to the first detection means sensing a positive going edge in the sensor signal, for sensing a negative going edge in the sensor signal;
   first delay means, responsive to the first detection means detecting the positive going edge, for providing a first predetermined time period, having a time period greater than the expected time period, during which the second detection means will not sense a negative going edge in the sensor signal; and
   second delay means, responsive to the second detection means detecting the negative going edge, for providing a second predetermined time period, having a time period greater than the expected time period but less than the minimum transition period, during which the first detection means will not sense another positive going edge in the sensor signal, and for indicating the zero crossing transition in the sensor signal in response to the second detection means sensing a negative going edge in the sensor signal.

6. A digital detector for indicating zero crossing transitions separated by at least a minimum transition period, each zero crossing transition having a positive going edge and a negative going edge, in a sensor signal provided by a reluctance sensor, wherein at least one burst of noise with an expected time period may randomly cause additional positive going and negative going edges to be present in the sensor signal, comprising:

disable means, responsive to an external signal, for momentarily disabling the digital detector;

first detection means, responsive to the sensor signal, for sensing a positive going edge in the sensor signal;

second detection means, responsive to the first detection meass sensing a positive going edge in the sensor signal, for sensing a negative going edge in the sensor signal;

first delay means, responsive to the first detection means detecting the positive going edge, for providing a first predetermined time period, having a time period greater than the expected time period of a noise burst, during which the second detection means will not sense a negative going edge in the sensor signal;

second delay means, responsive to the second detection means detecting the negative going edge, for providing a second predetermined time period, having a time period greater than the expected time period but less than the minimum transition period, during which the first detection means will not sense another positive going edge in the sensor signal;

first output means, responsive to said second detection means, for providing a first output signal to indicate that the negative going edge in the sensor signal was detected; and second output means, eesponsive to said first output means, for providing a second output signal having a minimum time period to indicate the detection of a zero crossing transition in the sensor signal.

7. A digital detector, according to claim 6, wherein the first detection means includes a flip-flop which is set via the positive going edge.

8. A digital detector, according to claim 7, wherein the first delay means includes means for resetting the flip-flop when the first predetermined time period lapses.

9. A digital detector, according to claim 7, wherein the second delay means includes means for resetting the flip-flop during the second predetermined time period.

10. A digital detector, according to claim 8, wherein the second delay means includes means for resetting the flip-flop during the second predetermined time period.

11. A digital detector, according to claim 6, wherein the disable means includes a latch in series with the sensor signal and a monostable output circuit, responsive to the the external signal, for inhibiting the latch for a predetermined period of time so that during the predetermined period of time, the latch will prevent the detector from receiving the sensor signal.

* * * * *